(12) United States Patent
Matz et al.

(10) Patent No.: US 8,164,904 B2
(45) Date of Patent: Apr. 24, 2012

(54) ELECTRONIC COMPONENT MODULE

(75) Inventors: Richard Matz, Bruckmuhl (DE);
Bernhard Siessegger, Munich (DE);
Steffen Walter, Oberpframmern (DE)

(73) Assignee: OSRAM AG, Munich (DE)

( * ) Notice: Subject to any disclaimer, the term of this patent is extended or adjusted under 35 U.S.C. 154(b) by 136 days.

(21) Appl. No.: 12/226,471

(22) PCT Filed: Apr. 11, 2007

(86) PCT No.: PCT/EP2007/053523
§ 371 (c)(1),
(2), (4) Date: Nov. 20, 2008

(87) PCT Pub. No.: WO2007/118831
PCT Pub. Date: Oct. 25, 2007

(65) Prior Publication Data
US 2009/0097208 A1 Apr. 16, 2009

(30) Foreign Application Priority Data

Apr. 19, 2006 (DE) .................. 10 2006 018 161

(51) Int. Cl.
*H05K 7/20* (2006.01)
(52) U.S. Cl. ........ 361/713; 361/709; 361/719; 361/758; 361/761; 174/252; 174/520; 257/718
(58) Field of Classification Search ............ 361/71–713, 361/715, 717–722, 748, 752, 758, 761
See application file for complete search history.

(56) References Cited

U.S. PATENT DOCUMENTS

| 4,630,172 | A | * | 12/1986 | Stenerson et al. | 361/718 |
| 4,894,706 | A | | 1/1990 | Sato | |
| 4,970,575 | A | | 11/1990 | Soga et al. | |
| 5,557,502 | A | | 9/1996 | Banerjee et al. | |
| 5,578,796 | A | * | 11/1996 | Bhatt et al. | 174/260 |
| 5,728,248 | A | * | 3/1998 | Weber | 156/257 |
| 5,943,213 | A | | 8/1999 | Sasov | |
| 6,075,287 | A | * | 6/2000 | Ingraham et al. | 257/706 |
| 6,284,982 | B1 | * | 9/2001 | Kusner et al. | 174/255 |
| 6,449,168 | B1 | * | 9/2002 | Soderholm | 361/761 |
| 6,462,950 | B1 | * | 10/2002 | Pohjonen | 361/704 |
| 6,501,662 | B2 | | 12/2002 | Ikeda | |
| 2003/0062185 | A1 | | 4/2003 | Hammond et al. | |

(Continued)

FOREIGN PATENT DOCUMENTS

DE 19859739 7/2000

(Continued)

OTHER PUBLICATIONS

International Search Report dated Dec. 11, 2007, in PCT application.

(Continued)

*Primary Examiner* — Courtney Smith

(57) ABSTRACT

An electronic component module includes at least one first multi-layer circuit board module (21, 22; 31, 32; 41, 42) and a cooling arrangement (23, 33, 43), the cooling arrangement (23, 33, 43) being in contact with an upper side of the circuit board module (21, 22; 31, 32; 41, 42). The cooling arrangement (23, 33, 43) is designed such that waste heat generated during operation of the electronic component module (2, 3, 4) is extracted in a lateral direction with relation to the arrangement of the circuit board module (21,22; 31, 32; 41, 42) by the cooling arrangement (23, 33, 43).

15 Claims, 8 Drawing Sheets

U.S. PATENT DOCUMENTS

2004/0222433 A1* 11/2004 Mazzochette et al. .......... 257/99
2009/0311826 A1* 12/2009 Bernstein et al. ............. 438/106

FOREIGN PATENT DOCUMENTS

| | | |
|---|---|---|
| DE | 19950026 | 4/2001 |
| DE | 102004019443 | 8/2005 |
| DE | 102004018477 | 11/2005 |
| EP | 0688053 | 12/1995 |
| JP | 61159752 A | 7/1986 |
| JP | 4257286 A | 9/1992 |
| JP | 888299 A | 4/1996 |
| JP | 8241954 A | 9/1996 |
| JP | 11501157 A | 1/1999 |
| JP | 11317473 A | 11/1999 |
| JP | 2000133745 A | 5/2000 |
| JP | 2001211663 A | 8/2001 |

OTHER PUBLICATIONS

English language abstract for JP 8-88299 A.
English language abstract for JP 8-241954 A.
English language abstract for JP 4-257286 A.
English language abstract for JP 2000-133745 A.
English language abstract for JP 11-317473 A.

* cited by examiner

ELECTRONIC COMPONENT MODULE

TECHNICAL FIELD

The present invention relates to an electronic component module comprising at least one multilayer circuit carrier assembly.

PRIOR ART

Component technology is associated with a constant endeavor aiming to make the performance of these component modules ever higher, on the one hand, and to make said component modules ever smaller, on the other hand. New materials, process technologies and structural technical concepts enable electronic components having faster switching cycles and more compact designs. One problem that occurs in the course of such miniaturization can be seen in the dissipation of the waste heat that occurs during operation of these component modules. The compactness of such component modules is achieved in various ways, multilayer circuit carrier assemblies being highlighted since the customary two-dimensional circuit boards can be greatly miniaturized by the redistribution of the area in the third dimension. In general, the problem of dissipating the heat loss arises from the fact that the electrically insulating materials available for circuit carrier assemblies enable only a limited thermal conduction.

Material- and process-technological solutions for heat dissipation from lossy electrical devices are known primarily from power electronics. Thus, WO 2004/045016 A2 discloses a composite of a multilayer ceramic substrate using LTCC (Low Temperature Cofired Ceramic) technology, wherein a metallic carrier is formed below this ceramic substrate, and power components are mounted on the top side of this ceramic substrate. Metallic thermal vias are formed through the ceramic substrate, said vias being led to the metal carrier in order to be able to dissipate the waste heat generated in the vertical direction.

A further thermal coupling can be achieved by power components being mounted directly onto a metallic carrier in an opening in a circuit carrier. Configurations of this type are known from US 2003/0062185 A1 and US 2004/0222433 A1.

In this case, the connection between ceramic circuit carrier and metallic heat sink can be produced e.g. by means of an adhesive bonding connection, a soldering connection or during sintering of the ceramic (cofiring). However, these solutions are intended for two-dimensional arrangements of components. e.g. light emitting diodes, and the waste heat generated is dissipated practically exclusively only perpendicular to the plane of the metal carrier downward.

For multilayer, thermally robust circuit carriers provision can also be made for using LTCC technology, which enables practically an unlimited number of layers, and also thermal vias and stamped-out windows. Furthermore, it is possible for a plurality of ceramic circuit carriers to be stacked one above another in mechanical and electrical assemblage by means of so-called ball grid arrays to form a three-dimensional module. However, cooling of the devices cannot be realized in a straightforward manner in the case of these modules.

Furthermore, stackability of a plurality of circuit carrier assemblies one above another is not possible in the case of known component modules on account of the vertical heat dissipation therein.

SUMMARY OF THE INVENTION

Therefore, the present invention is based on the object of providing an electronic component module which can be constructed compactly and enables an improved dissipation of heat.

This object is achieved by means of an electronic component module having the features according to patent claim 1.

An electronic component module according to the solution comprises at least one first multilayer circuit carrier assembly and a cooling arrangement, wherein the cooling arrangement is contact-connected to a top side of the circuit carrier assembly, in particular over the largest possible area, and is embodied in such a way that waste heat generated during operation of the electronic component module can be dissipated in a lateral direction with respect to the arrangement and orientation of the circuit carrier assembly by means of the cooling arrangement. This configuration enables, on the one hand, a compact component module comprising a multilayer circuit carrier assembly, wherein the waste heat generated can be dissipated by means of an improved designing. Consequently, vertical dissipation of the heat, which necessitates the formation of vias in order to obtain contact-connection to a metallic carrier, is no longer carried out, rather horizontal dissipation is carried out. This heat dissipation concept enables improved stackability of the circuit carrier assemblies with regard to a compact, cube-like shaping of the electronic component module. The lateral extraction of the waste heat laterally with respect to the multilayer circuit carrier assemblies also enables more effective and more efficient dissipation of heat from the elements. In order to obtain a lowest possible thermal resistance between the circuit carrier assemblies and the heat sinks, a material having a highest possible thermal conductivity is preferably to be used for the cooling arrangement.

Preferably, the cooling arrangement extends beyond the dimensions of the circuit carrier assembly in a lateral direction at least at one side of the circuit carrier assembly. It is thereby possible to achieve effective dissipation and simple contact-connection to a housing of the electronic component module.

The cooling arrangement is embodied in plate-type fashion at least in regions. It is thereby possible to achieve relatively large-area contact-connection to the electronic circuit carrier assembly.

Preferably, the cooling arrangement is embodied at least in regions as a side wall of a housing of the electronic component module. It is thereby possible to achieve a very compact arrangement.

It may be provided that at least one multilayer circuit carrier assembly has at least one insulation layer, at least one device layer and at least one conductor track layer. The layers mentioned can vary both with regard to their arrangement with respect to one another and with regard to their number. It may be provided that, in a layer sequence, the insulation layer is followed by the device layer and the device layer is followed by the conductor track layer. It may also be provided that the conductor track layer constitutes the topmost layer, which is then followed by the device layer and then by the insulation layer. It may also be provided that a further insulation layer is formed between the device layer and the conductor track layer. A cooling arrangement can preferably be arranged at that side of the conductor track layer which is remote from the device layer or the further insulation layer possibly present. Furthermore, a further cooling arrangement can also follow the insulation layer, whereby a cooling arrangement for laterally dissipating heat is in each case arranged on both sides—at the top and bottom—of the circuit carrier assembly.

Preferably, an interlayer, in particular an insulating interlayer, is formed between the first circuit carrier assembly and a second circuit carrier assembly and a cooling arrangement is in each case arranged at the top sides of the circuit carrier assemblies remote from said interlayer. The conductor track layer preferably adjoins the interlayer and the cooling arrangement advantageously adjoins the insulation layer.

A circuit carrier assembly can in each case be arranged at opposite sides of the interlayer, which assemblies can be embodied identically or, alternatively, differently with regard to layer arrangement and number of layers.

The cooling arrangements are preferably connected to one another at their edge regions laterally with respect to the circuit carrier assemblies, in particular by thermally conductive spacer elements. This connection can preferably be formed by vertically oriented spacer elements, which are embodied in particular in thermally conductive fashion. It is thus possible to realize an electronic component module having a multilayer circuit carrier in each case at opposite sides of the interlayer, wherein the circuit carrier assemblies are connected to a respective cooling arrangement at least in regions at their uncovered top sides, in particular essentially the horizontal top sides. The cooling arrangements bear directly on said top side. Such a sandwich arrangement comprising in the stack a cooling arrangement, in particular a cooling layer, an adjacent first multilayer circuit carrier assembly, followed by an interlayer, followed in turn by a second multilayer circuit carrier assembly and finally a cooling arrangement again, enables a very compact realization of the component module which ensures better dissipation of heat. What is more, such a sandwich structure can be stacked one on top of another as often as desired.

However, any other stack orders of cooling arrangements, circuit carrier assemblies and interlayers are also possible.

The arrangement of the cooling layers at the free top sides of the circuit carrier assembly, and in particular the realization in which the horizontal cooling arrangements are connected by spacer elements in a vertical direction, enables the realization to the effect that the cooling arrangements simultaneously constitute the housing of the electronic component module.

In this case, it may also be provided that the interlayer, in particular a PCB substrate or a DCB (Direct Copper Bonded Aluminum Nitride Substrate) substrate, is likewise embodied in heat-dissipating fashion. By way of example, it may be provided that the interlayer has a metallic core, in particular an aluminum or copper core. The invention presented proves to be particularly advantageous if a connection with molded leadframe technology is present. In this case, individual or all elements comprising the cooling arrangements, the circuit carrier assemblies and the interlayers can be embodied using molded leadframe technology. In such an embodiment, all the layers of the circuit carrier assemblies can also be embodied in spatially curved fashion at least in regions, whereby both the insulation layer and the device layer as well as the conductor track layer can be spatially curved. As a result, any desired devices can be cooled over essentially all their uncovered areas. It may then also be provided that relatively thick conductor tracks or metal deep-drawn parts, for example aluminum or copper deep-drawn parts, can be encapsulated with plastic by injection molding at least in regions and these configurations and generalizations are ultimately dependent only on the sum of the current loading and thermal loading and the insulation strength in the electronic component module. An integration of current carrying and cooling can thereby be made possible. Furthermore, the outer sides of the circuit carrier assemblies form the housing including any cooling fins and have an inlay mold for insulation, wherein thermal coupling of the next layer can nevertheless be achieved. What can also be made possible in the case of such a sandwich configuration, in contrast to a potting embodiment, is that no adhesive bonding of the circuit carrier assembly to the interlayer is provided. In a cooling arrangement, it is preferably possible to provide a section that is simultaneously formed as a plug or socket for making electrical contact with the cooling arrangement.

Preferably, at least one of the cooling arrangements and/or at least one of the interlayers and/or at least one of the circuit carrier assemblies can be embodied using molded leadframe technology.

Preferably, the cooling arrangement is formed from metal at least in regions and is advantageously formed as a metallic plate.

The cooling arrangement is preferably arranged at least in regions as an interlayer between the first circuit carrier assembly and a second multilayer circuit carrier assembly. It is thereby possible to achieve a lateral cooling of two circuit carrier assemblies by means of one cooling arrangement. Furthermore, the compactness of the construction can be additionally improved.

At least one third circuit carrier assembly can be arranged which is contact-connected to a further cooling arrangement, wherein the cooling arrangement contact-connected to the first and the second circuit carrier assemblies is connected to the further cooling arrangement by at least one spacer element.

Preferably, at least one ball grid array and/or at least one spring contact and/or at least one pluggable pin are formed as electrical contact-connection between the third circuit carrier assembly and the first or the second circuit carrier assembly. It is thereby possible to ensure reliable contact-connection even in the event of thermal expansions of the elements. The electrical contact-connection of the circuit carrier assemblies which are not arranged at opposite sides of a common interlayer or cooling arrangement can thereby be effected in diverse ways. The best possible electrical contact-connection can be realized depending on the manufacturing technology.

Preferably, continuous electrical contact-connections, in particular vias, for making contact with the two circuit carrier assemblies among one another are formed in the cooling arrangement, wherein the electrical contact-connections are insulated from the cooling arrangement.

Preferably, at least one circuit carrier assembly has a plurality of LTCC layers preferably having integrated devices. As a result, a three-dimensional stack form of an electronic component module can be made possible in a compact and cube-like manner and be realized with a heat dissipation concept of a metal-ceramic composite.

Preferably, a plug connection for externally making electrical contact with the electronic component module is introduced into the cooling arrangement. This is advantageous particularly when at least one cooling arrangement constitutes a housing wall of the electronic component module. Said housing wall can constitute a main heat sink.

Preferably, the spacer elements are embodied in electrically insulating fashion and the cooling arrangements connected by such a spacer element can preferably be put at different electrical potentials. It may be provided that electrical contact is made with the electronic component module toward the outside by means of the at least two cooling arrangements which are at different electrical potentials.

Preferably, cooling fins are formed at least at the edge regions of the cooling arrangements.

Preferably, the cooling arrangements extend in a lateral direction and thus laterally with respect to the circuit carrier assemblies beyond the position of the spacer elements. This means that the vertically oriented spacer elements are indented from the edge regions of the cooling arrangements in a direction toward the circuit carrier assemblies, such that free ends of the cooling arrangements are formed in a horizontal direction. Cooling fins can preferably be formed at said edge regions of the cooling arrangements. The dissipation of the waste heat generated can thereby be additionally improved.

Further advantageous embodiments will become apparent from the exemplary embodiments explained in greater detail below with reference to schematic drawings.

BRIEF DESCRIPTION OF THE DRAWINGS

Exemplary embodiments of the invention are explained in more detail below with reference to schematic drawings, in which.

PREFERRED EMBODIMENT OF THE INVENTION

In the figures, identical or functionally identical elements are provided with the same reference symbols.

Figure 1:
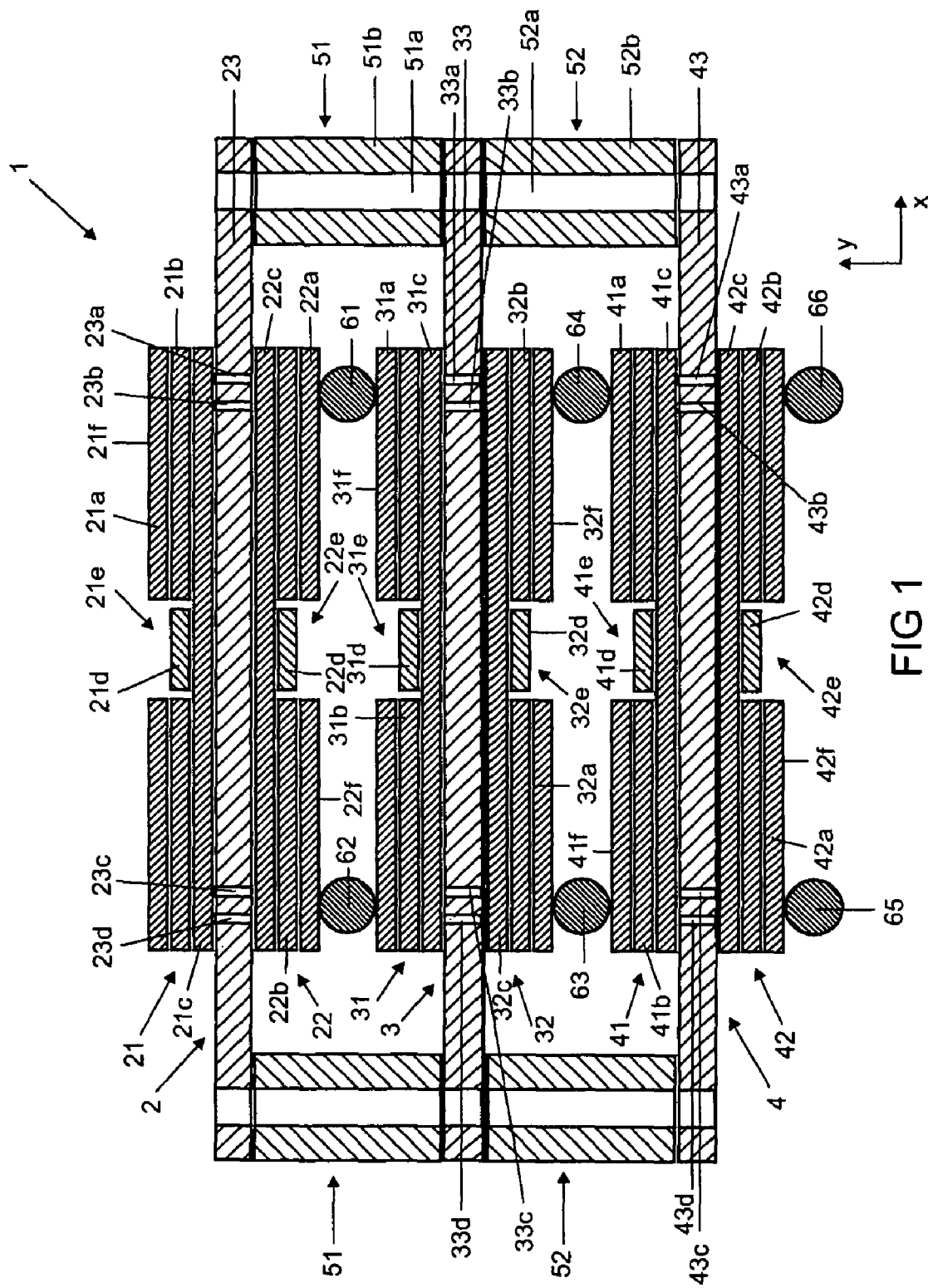
FIG. 1 shows a sectional illustration of a first exemplary embodiment of an electronic component module according to the invention.

FIG. 1 shows a sectional illustration of a first exemplary embodiment of a component module system 1 comprising three electronic component modules 2, 3 and 4. The first electronic component module 2 comprises a first multilayer circuit carrier assembly 21 and a second multilayer circuit carrier assembly 22. An interlayer 23 is arranged between the two circuit carrier assemblies 21 and 22, said interlayer being embodied as a metallic plate in the exemplary embodiment. Said interlayer 23 is designed for cooling the electronic component module 2 and is referred to hereinafter as cooling arrangement 23 or cooling layer. This cooling arrangement 23 is thus formed with top sides of the circuit carrier assemblies 21 and 22 bearing directly against one another over an areal region. By virtue of this arrangement, it is possible to form, in particular in a lateral direction (x direction), a relatively large contact region between the cooling arrangement 23 and the circuit carrier assemblies 21 and 22, whereby an improved dissipation of heat can be achieved. In particular, this areal contact region extends over the entire area region in the x-z plane (perpendicular to the plane of the figures).

In the exemplary embodiment, the first multilayer circuit carrier assembly 21 has three LTCC layers 21a to 21c arranged vertically one above another. Components and conductor tracks (not designated more specifically) are formed in the LTCC layers 21a to 21c. As can be discerned, an integrated circuit 21d is arranged on the layer 21c, said integrated circuit being positioned in a cutout 21e formed both in the layer 21a and in the layer 21b. In the exemplary embodiment shown, the second multilayer circuit carrier assembly 22, which is arranged on the opposite side of the cooling arrangement 23, likewise comprises three LTCC layers 22a to 22c, which are likewise formed as LTCC glass ceramics. Here, too, an integrated circuit 22d is arranged on the layer 22c, said integrated circuit being positioned in a cutout 22e in the layers 22a and 22b.

As can be discerned from the illustration in FIG. 1, the cooling arrangement 23 extends in the x direction and thus in a lateral or horizontal direction of the entire component module system 1 beyond the dimensions of the two circuit carrier assemblies 21 and 22. For making electrical contact with the two circuit carrier assemblies 21 and 22, electrically contact-connecting vias 23a, 23b, 23c and 23d are formed in the cooling arrangement 23. Said vias 23a to 23d provided for making electrical contact are electrically insulated from the cooling arrangement 23 however. In the exemplary embodiment, the cooling arrangement 23 also extends beyond the dimensions of the two circuit carrier assemblies 21 and 22 in a plane running perpendicular to the plane of the figures (x-z plane). However, it may also be provided that the cooling arrangement extends beyond the configuration of the circuit carrier assemblies 21 and 22 in a lateral direction (x direction) only on the right or left in the sectional view illustrated.

By means of the cooling arrangement 23, waste heat generated during the operation of the electronic component module 2 can be conducted laterally (x direction) toward the outside, in particular can be dissipated laterally with respect to the circuit carrier assemblies 21 and 22 in a lateral direction. In a three-dimensional illustration, such lateral dissipation of heat would then be possible in an x-z plane since the cooling arrangement 23 also preferably extends correspondingly in the z direction (perpendicular to the plane of the figures).

As is shown in FIG. 1, the component module system 1 has a second electronic component module 3, which is arranged below the first electronic component module 2 and is formed analogously to the first electronic component module 2. This component module 3 also has two multilayer circuit carrier assemblies 31 and 32, which, in the exemplary embodiment, in each case also comprise three LTCC layers 31a, 31b, 31c and 32a, 32b and 32c, respectively, which are formed as LTCC glass ceramic layers. Here, too, a cooling arrangement 33 is arranged as a carrier, wherein top sides of the circuit carrier assemblies 31 and 32 adjoin the cooling arrangement 33 at opposite sides.

A respective integrated circuit 31d and 32d is arranged in LTCC layers 31c and 32c, respectively. Here, too, cutouts 31e and 32e are formed therefor respectively in the layers arranged thereabove. For making electrical contact with the circuit carrier assemblies 31 and 32 arranged at opposite sides of the cooling arrangement 33, electrical contact-connections in the form of vertical vias 33a, 33b, 33c and 33d are formed in the cooling arrangement 33. These vias 33a to 33d, too, are arranged in a manner electrically insulated from the metallic cooling arrangement 33.

For electrically connecting the first electronic component module 2 to the second electronic component module 3, so-called ball grid arrays 61 and 62 are formed in the embodiment shown, and are contact-connected to top sides or outer sides 22f and 31f of the LTCC layers 22a and 31a, respectively.

A third electronic component module 4 of the component module system 1 is formed analogously to the electronic component modules 2 and 3. The third electronic component module 4 is arranged below the second electronic component module 3 in the y direction, such that a three-dimensional stack form with compact cube-like shaping is formed by the component module system 1, which has a heat dissipation concept of a metal-ceramic composite.

The third electronic component module 4 also comprises a central metallic, plate-type cooling arrangement 43, wherein multilayer circuit carrier assemblies 41 and 42 are formed at opposite sides of said cooling arrangement 43. Here, too, the circuit carrier assemblies 41 and 42 in each case have three LTCC glass ceramic layers 41a, 41b, 41c and 42a, 42b, 42c, respectively. Integrated circuits 41d and 42d are arranged on the LTCC layers 41c and 42c, respectively. Cutouts 41e and 42e are in turn formed therefor in the overlying layers 41a, 41b and 42a, 42b, respectively. Here, too, for making electrical contact with the two circuit carrier assemblies 41 and 42, electronic contact-connections in the form of vias 43a, 43b, 43c and 43d are formed in the cooling arrangement 43, said vias being electrically insulated.

The two cooling arrangements 33 and 43 are embodied in a manner corresponding to the cooling arrangement 23 in terms of their dimensions.

Spacer elements 51 and 52 are in each case formed at the edge regions of the cooling arrangements 23, 33 and 43 in order to produce a connection between the cooling arrangements 23 and 33, and respectively 33 and 43. Each spacer element 51 and 52 has a core region 51a and 52a, respectively, which is surrounded by a sheath element 51b and 52b, respectively. The core region 51a, 52a can be formed as a hole. A screw connection can be provided for mounting and fixing the elements of the component module system 1, wherein a screw can be inserted into the holes and into the holes that are likewise formed and illustrated at the edge regions of the cooling arrangements 23, 33 and 43.

However, it may also be provided that the connection is formed by a rivet connection, for example. Rivet elements or bolts would then be inserted into the core regions 51a and 52a.

The spacer elements 51 and 52 are embodied in thermally conductive fashion and arranged for laterally dissipating the waste heat generated in the component module system 1. As can be discerned from the illustration in FIG. 1, the spacer elements 51 and 52 are positioned in the x direction in such a way that they are arranged essentially flush with the lateral edges of the cooling layers 23, 33 and 43.

The second electronic component module 3, too, is electrically contact-connected to the third electronic component module 4 by means of ball grid arrays 63 and 64 formed at top sides 32f and 41f of the corresponding layers 32a and 41a.

Furthermore, electrical contact-connections in the form of ball grid arrays 65 and 66 are provided at an outer side or top side 42f of the layer 42a in order, if appropriate, to enable contact to be made with a further electronic component module or even a further component module system. The contact-connection by means of the ball grid arrays 61 to 66 makes it possible to compensate for mechanical stresses produced by thermal mismatch of the elements, that is to say that the elements have significantly different coefficients of thermal expansion.

By means of the lateral dissipation of the waste heat generated and the formation of the cooling arrangements 23, 33 and 43 beyond the dimensions of the circuit carrier assemblies 21, 22, 31, 32, 41 and 42, in conjunction with the spacer elements 51 and 52 arranged laterally with respect to said circuit carrier assemblies 21, 22, 31, 32, 41 and 42, an effective heat dissipation concept can be made possible. What is more, however, it is also possible to achieve a very compact embodiment of the entire component module system 1.

The ceramic LTCC layers of the respective circuit carrier assemblies 21, 22, 31, 32, 41 and 42 can deviate diversely in number and arrangement from the exemplary embodiment shown in FIG. 1, and can also be arranged and designed completely differently. What is essential is that the cooling arrangements 23, 33 and 43 are positioned and formed in such a way that a lateral cooling concept can be realized.

The ceramic LTCC layers 21a to 21c, 22a to 22c, 31a to 31c, 32a to 32c, 41a to 41c and 43a to 43c are realized as carriers of an electrical circuit, wherein said electrical circuit can be produced for example by screen-printed conductor tracks. The fitting of the circuit carrier assemblies 21, 22, 31, 32, 41, 42 to the respective cooling arrangements 23, 33 and 43 can be effected for example by means of an adhesive bonding connection or a soldering connection or by means of a sintering process. The metallic material of the cooling arrangements 23, 33, 43 is chosen or produced as an alloy or composite material such that, on the one hand, for the required temperature window, it is thermally matched to the ceramic of the layers mentioned and, on the other hand, has a highest possible thermal conductivity. One example of such reciprocal matching can be seen in a realization in which the layers of the circuit carrier assemblies 21, 22, 31, 32, 41 and 42, as already explained, are formed as LTCC glass ceramic layers and the cooling arrangements 23, 33 and 43 are formed from a copper-molybdenum composite material. This copper-molybdenum composite material preferably has a coefficient of expansion of 8 ppm/K and a thermal conductivity of 200 W/mK to 300 W/mK. In this case, the coefficient of expansion was chosen to be very close to that of the LTCC ceramic used.

It may be provided that the electronic component module system 1 shown in FIG. 1 is arranged in a housing (not illustrated). For dissipating heat from the housing, it is possible to form a thermally conductive contact-connection between the housing and at least one cooling arrangement 23, 33, 43 and/or at least one of the spacer elements 51, 52. It may thus be provided that for example the vertical edge region on the right in FIG. 1, formed from the edges of the cooling arrangements 23, 33 and 43 and also the edges of the spacer elements 51 and 52, bears on an inner wall of the housing. The component module system 1 can be screwed to the housing. It is also possible to form a plurality of contact-connections for heat dissipation between the component module system 1 and the housing.

Besides the ball grid arrays 61 to 66 realized in the exemplary embodiment in accordance with FIG. 1, it is also possible to provide an electrical contact-connection by means of spring contacts or by means of pluggable pin strips, as can be realized in the case of so-called dual in-line (DIL) housings, which counterbalance a thermal mismatch possibly present. A larger vertical distance (y direction) between the individual planes that is required for spring contacts or pin strips furthermore also serves for better electrical insulation for the case where there are large electrical potential differences between adjacent planes. Instead of the ball grid arrays 61 to 66, it is also possible to provide bonding wires, for example.

If an electrical voltage separation between circuit carrier assemblies is intended to be increased further, then it may be provided that at least one insulating film, for example composed of Kapton, is arranged into the resulting intermediate region. This is shown for example in the configuration of the component module system 1 in accordance with the sectional illustration in FIG. 2. This exemplary embodiment of the component module system 1 corresponds to the configuration in accordance with FIG. 1 and therefore shows, for the sake of clarity, only reference symbols for superordinate elements, the detailed configuration of which has already been specified in greater detail in the explanation concerning FIG. 1.

Figure 2:
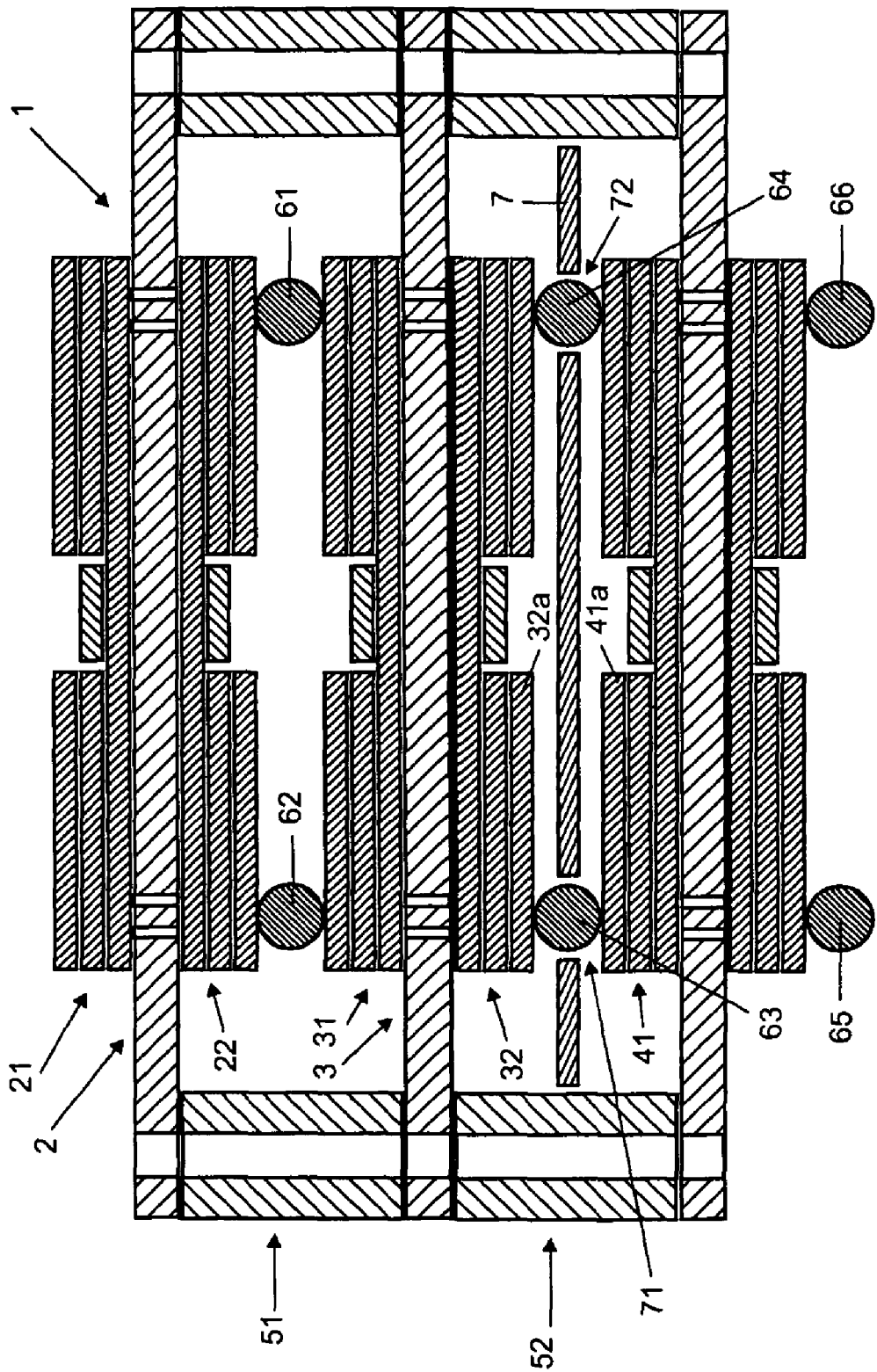
FIG. 2 shows a sectional illustration through a second exemplary embodiment of an electronic component module according to the invention.

In contrast to the configuration in accordance with FIG. 1, the embodiment in FIG. 2 has an insulating film 7 arranged between the second electronic component module 3 and the third electronic component module 4. Said insulating film 7, which is embodied as a Kapton film in the exemplary embodiment, is arranged in particular between the multilayer circuit carrier assembly 32 and the multilayer circuit carrier assembly 41. As can be discerned here, said insulating film 7 is positioned at a distance from the LTCC layer 32a of the circuit carrier assembly 32 and at a distance from the LTCC layer 41a of the circuit carrier assembly 41.

Furthermore, the film 7 has stamped-out portions or cutouts 71 and 72 in order to be able to lead through the ball grid arrays 63 and 64 or an alternative electrical connection. As can be discerned, the cutouts 71 and 72 are dimensioned in such a way that the ball grid arrays 63 and 64 are arranged at a distance from the insulating film 7. The insulating film 7 extends beyond the dimensions of the circuit carrier assemblies 32 and 41 in a horizontal direction (x direction).

However, it may also be provided that the insulating film 7 has dimensions chosen in such a way that the insulating film 7 only extends between the ball grid arrays 63 and 64 in a horizontal direction. In the case of a configuration of this type, said insulating film 7 is inserted into the interspace between the circuit carrier assemblies 32 and 41. It can lie loosely in said interspace in this case. By means of said insulating film 7, the air clearance between the circuit carrier assemblies 32 and 41 can be extended, such that flashovers from an LTCC layer of the circuit carrier assembly 32 to an LTCC layer of the circuit carrier assembly 41 can be prevented. An insulating film 7 of this type can be arranged additionally or instead also between the circuit carrier assemblies 22 and 31. The insulating film 7 can also be fixed, for example adhesively bonded, to one of the circuit carrier assemblies 32 or 41. It may also be provided that the insulating film 7 is fixed to the spacer elements 52.

Figure 3:
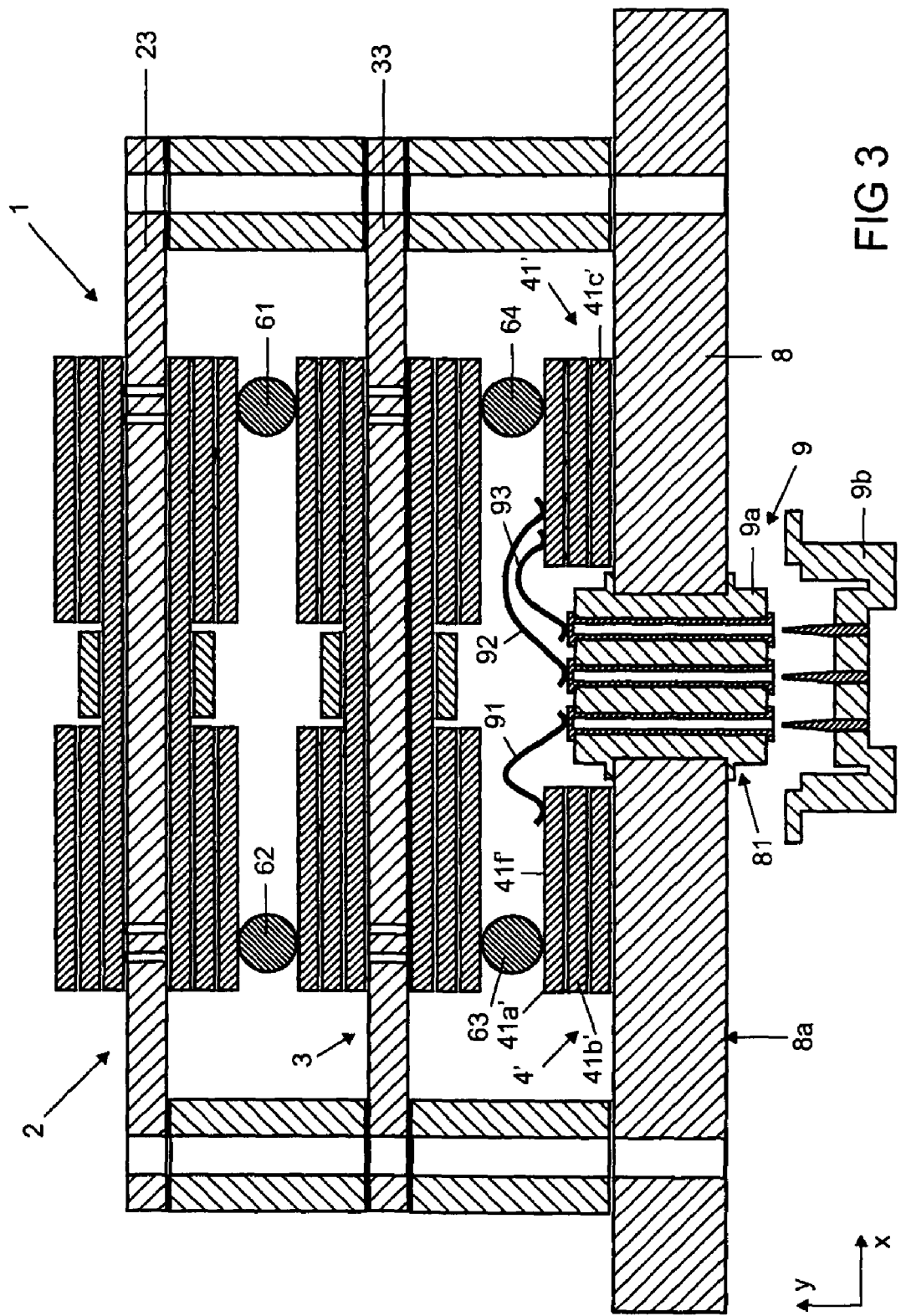
FIG. 3 shows a sectional illustration of a third exemplary embodiment of an electronic component module according to the invention.

FIG. 3 shows a sectional illustration of a further exemplary embodiment of a component module system 1 with a plurality of electronic component modules 2, 3 and 4'. In contrast to the embodiments in accordance with FIG. 1 and FIG. 2, the electronic component module 4' is formed only with a single multilayer circuit carrier assembly 41' in this realization. Said circuit carrier assembly 41' is arranged on a cooling arrangement 8 formed as bottommost heat dissipation layer. This cooling arrangement 8 is realized as a main heat sink of the entire component module system 1 and dimensioned with larger dimensions than the cooling arrangement 23 and 33 both in the horizontal direction and in the vertical direction. At the underside 8a, the cooling plate or the metallic cooling arrangement 8 is unpopulated and therefore has no electronic devices or components or circuit carriers. In particular the cooling arrangement 8 can in this case be used as a housing wall of a housing of the entire component module system 1.

As can be discerned from the illustration in FIG. 3, a continuous cutout 81 is formed into this cooling arrangement 8, a plug connection device 9 being fitted in said cutout. The plug connection device 9 has a plug element 9a, which is arranged fixedly in the cutout 81 and which is externally accessible and into which a plug element 9b can be inserted. External electrical contact-connection can thereby be made possible. Electrical contact-connections 91, 92 and 93 are fitted, in particular soldered, to the plug element 9a integrated into the cooling arrangement 8, and are electrically connected to the LTCC layer 41a' of the circuit carrier assembly 41'. It may also be provided that cutouts are formed in the cooling arrangements 23 and 33, through which cutouts a larger plug element 9a can then extend and electrical contact-connection to the corresponding circuit carrier assemblies of the electronic component modules 2 and 3 is possible.

It may also be provided that, in the case of an unpopulated underside 8a of the cooling arrangement 8, whole-area linking to a further heat sink or for example to a housing bottom of a housing (not illustrated) of the component module system 1 can be effected, which then serves as a further heat sink.

The individual levels or the individual electronic component modules 2 to 4 or 2 to 4' can be embodied with different functions and functionalities. Thus, it may be provided, for example, that power electronic devices with their relatively high voltages and currents are spatially separated from control functions (controller) and digital elements, whereby undesirable or destructive interactions can be prevented. By way of example, this is realized in the embodiment in accordance with FIG. 2.

Figure 4:
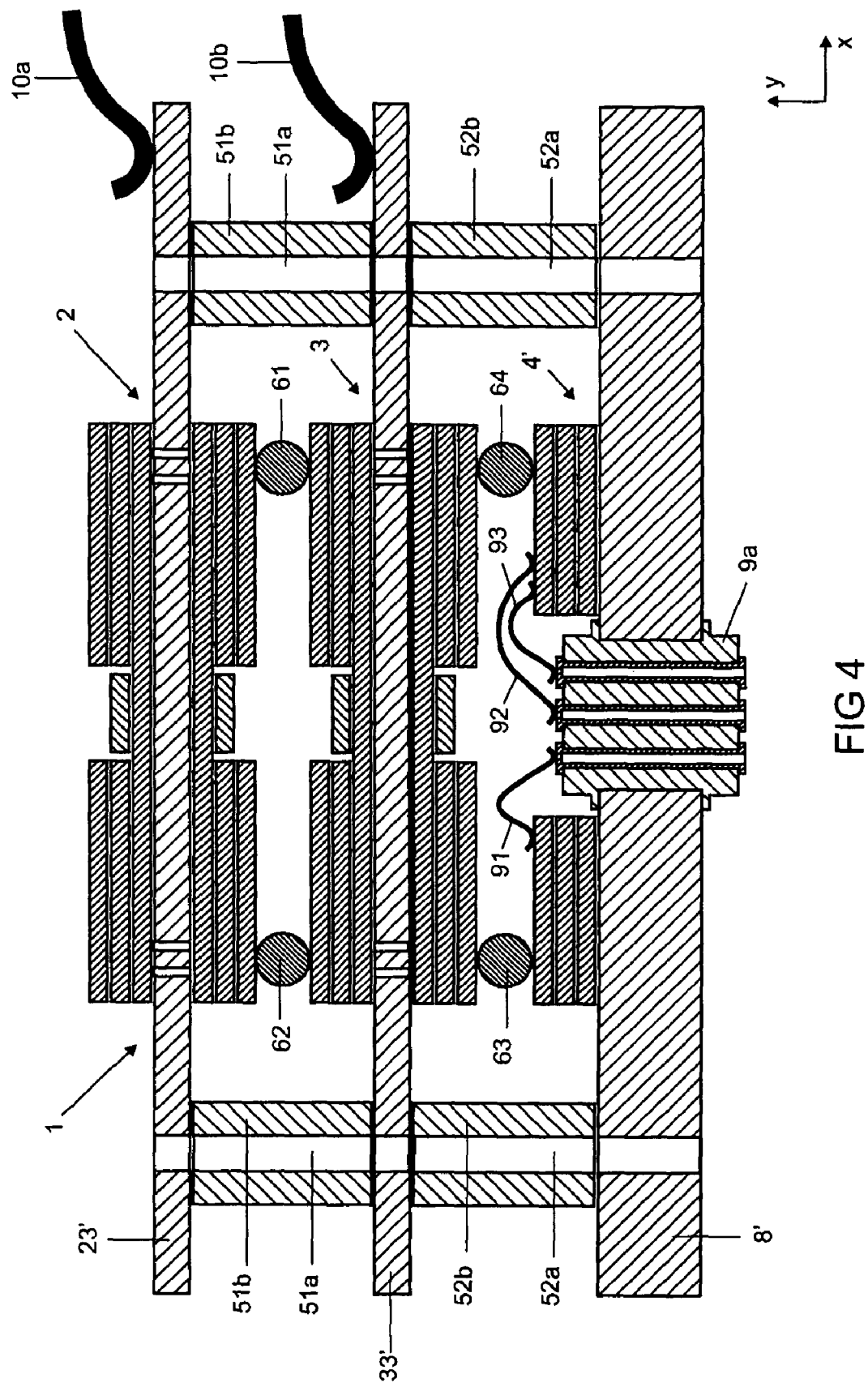
FIG. 4 shows a sectional illustration of a fourth exemplary embodiment of an electronic component module.

A further configuration of an electronic component module system 1 is shown in a sectional illustration in accordance with FIG. 4. In contrast to the embodiment in accordance with FIG. 3, here the spacer elements 51 and 52 are formed in electrically insulating fashion, which can make it possible that the cooling arrangements 23' and 33' can be at different electrical potentials. In particular the sheath elements 51b and 52b are formed from an electrically insulating material. The connections in the core regions 51a and 52a are also formed from an electrically insulating material or at least electrically insulated if electrically conductive parts are provided as connection elements. By using such electrically insulating spacer elements 51 and 52 and, if appropriate, an additional housing, it is possible for the cooling arrangements 23', 33' and 8' to be put at a potential that is respectively advantageous from a circuit-technological standpoint. As a result, they can additionally also serve as a current-carrying connection to a load that is connected by means of, for example, welded or hard soldered cables 10a and 10b. The electrical connection can additionally be effected by plug connections. In this case, a cooling arrangement can be embodied in such a way that it performs the function of a socket or a plug.

In order to enable such electrical contact-connection of the cables 10a and 10b, the configuration in accordance with FIG. 4 provides for the spacer elements 51 and 52 to be displaced in the x direction in the direction of the circuit carrier assemblies of the electronic component modules 2, 3 and 4'. The cooling layers 23', 33' and 8' therefore have free edge regions since the spacer elements 51 and 52 are no longer arranged flush with the edges of the cooling arrangements 23', 33' and 8' in a lateral direction.

Figure 5:
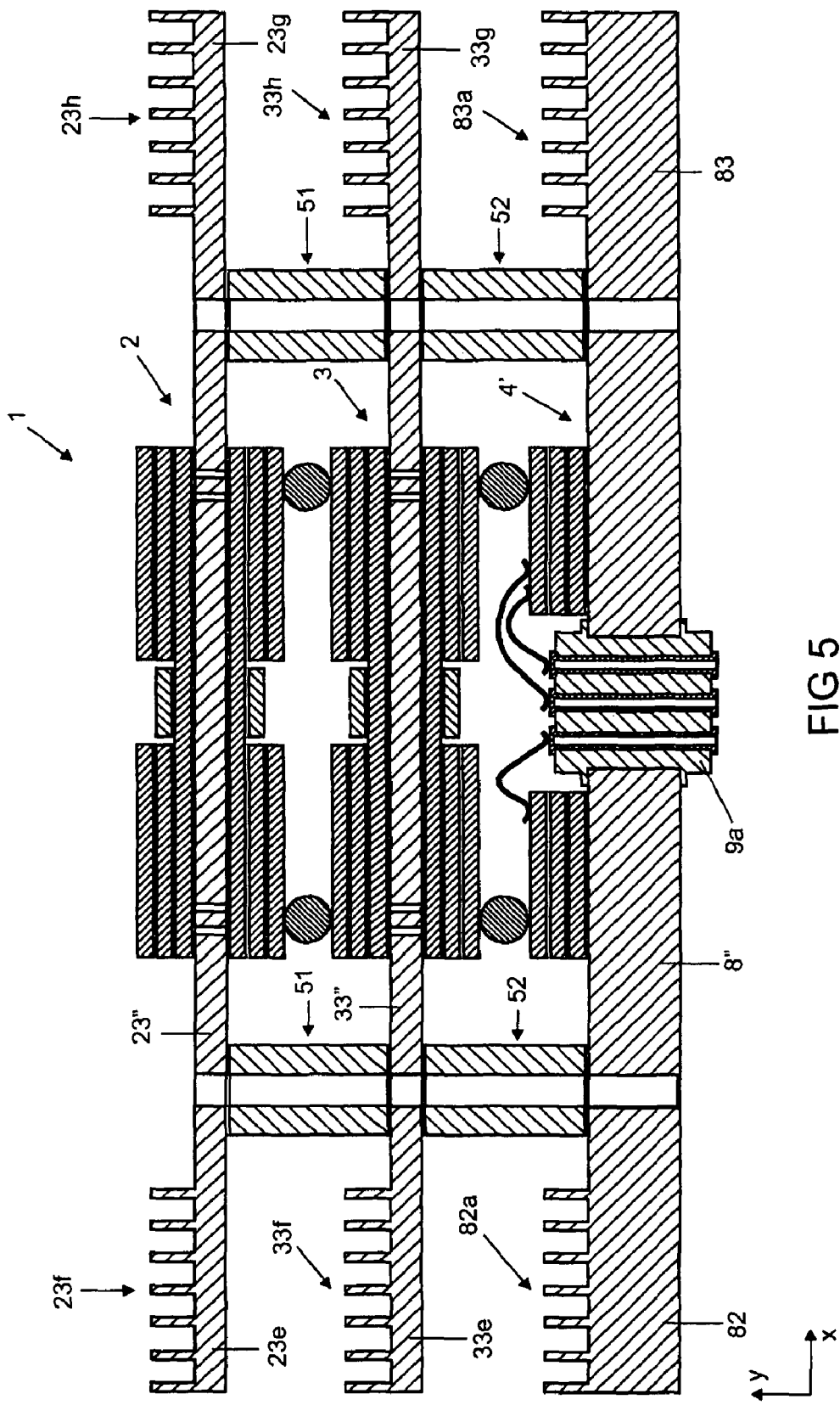
FIG. 5 shows a sectional illustration of a fifth exemplary embodiment of an electronic component module according to the invention.

FIG. 5 shows a further exemplary embodiment of a component module system 1 with a plurality of electronic component modules 2, 3 and 4' in a sectional illustration. The impairment—which possibly occurs in the configuration in accordance with FIG. 4—of the thermal resistance of the spacer elements 51 and 52 on account of the electrical insulating thereof can be counterbalanced by a convection cooling such as is realized in the configuration in accordance with FIG. 5. For this purpose, the configuration in accordance with FIG. 5 provides for the horizontally oriented cooling plates or cooling arrangements 23", 33'" and 8" to project further beyond the position of the spacer elements 51 and 52 in the horizontal direction (x direction). Furthermore, cooling lugs 23f and 23h can additionally be formed at the extended edge regions 23*e* and 23*g* of the cooling arrangement 23". This is effected in an analogous manner by formation of a plurality of cooling lugs 33*f* and 33*h* at the extended edge regions 33*e* and 33*g* of the cooling arrangement 33". This is correspondingly realized in the case of the cooling arrangement 8", in which cooling lugs 82*a* and 83*a* are formed at horizontally extended edge regions 82 and 83. In the exemplary embodiment shown, the cooling lugs 23*f*, 23*h*, 33*f*, 33*h*, 82*a* and 83*a* are oriented upward in the vertical direction (y direction). This is merely by way of example, however, and said cooling lugs can also be oriented vertically downward or else in a different direction.

By virtue of the arrangement of said cooling lugs 23*f*, 23*h*, 33*f*, 33*h*, 82*a* and 83*a*, it is possible to achieve an enlargement of the surface area of the cooling arrangement 23", 33" and 8" and thus to improve the heat dissipation in the lateral or horizontal direction.

Figure 6:
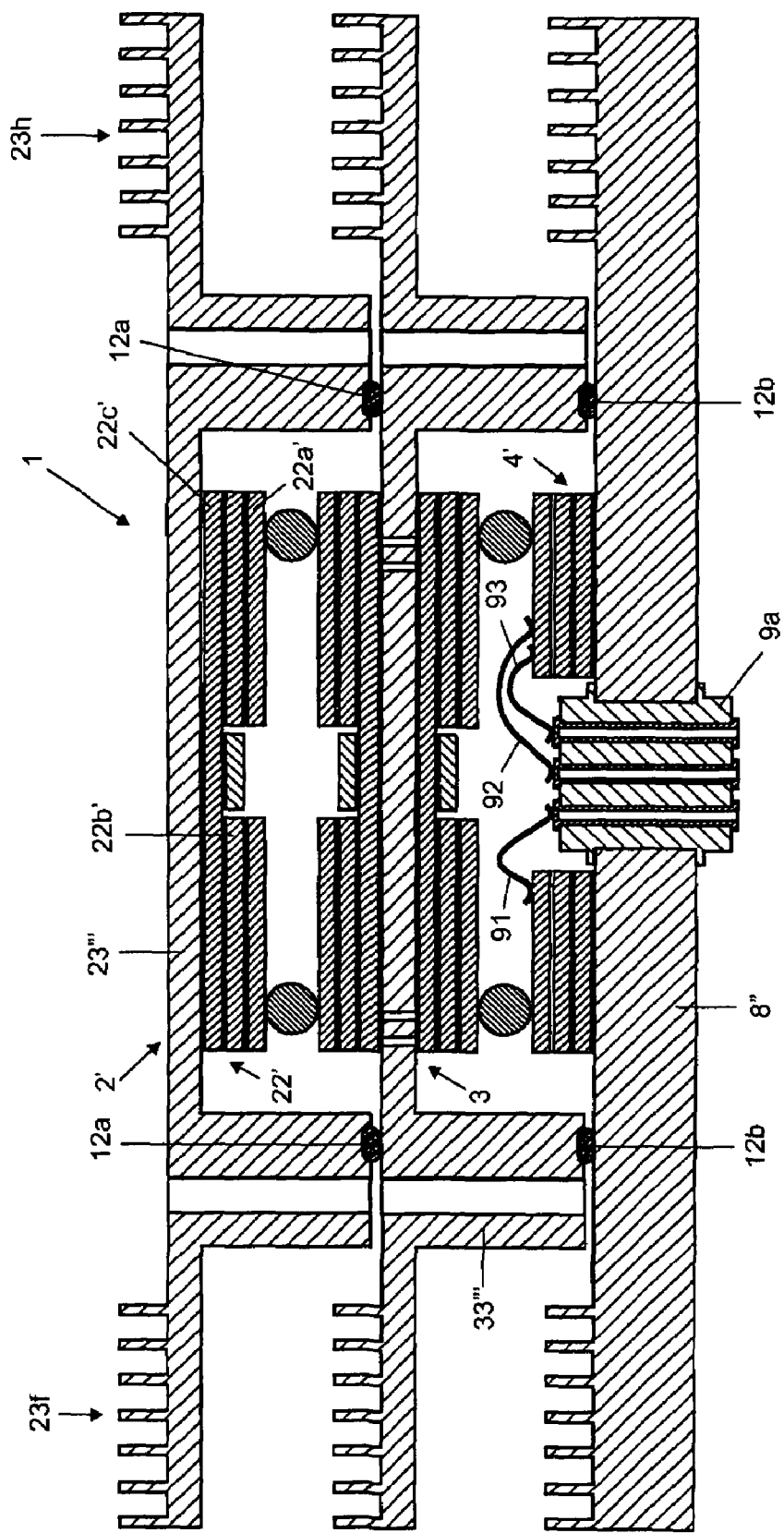
FIG. 6 shows a sectional illustration of a sixth exemplary embodiment of an electronic component module according to the invention.

A further embodiment of a component module system 1 is shown in the sectional illustration shown in FIG. 6. In the case of this embodiment, cooling arrangements 23''' and 33''' and 8" are arranged in a manner spaced apart from one another. The cooling arrangements 23''', 33''' are embodied in pot-shaped fashion, and can be realized as a cast part, for example. In this configuration, the spacer elements are thus integrated into the respective cooling layers 23''' and 33'''. As a result, a multilayer housing protected against dust and spray water can be formed in the course of stacking. Sealing rings 12*a* and 12*b* are arranged at the seams. Said sealing rings 12*a* and 12*b* can be composed for example of aluminum, copper, Viton, plastic or the like. Furthermore, a sealing by liquid or vapor phase coating, for example Parylene, after the assembly process may likewise be possible. The formation of the cooling fins 23*f* and 23*h* can also extend over the entire top side of the cooling arrangement 23'''. Here, too, it is possible to provide for example a screw connection for mounting the component modules, wherein here, too, screw elements can be screwed into the holes (core regions 51, 52*a* e.g. in FIG. 1), wherein corresponding threads can be formed in the cooling arrangement 8".

Stackability and a compact design are achieved by the dissipation of the heat loss from each individual level in a lateral direction. While individual levels are electrically connected by through-plating in the core region of the module, the thermal contact is effected spatially separately in the peripheral region. The latter simultaneously performs a stabilizing mechanical function and even forms a complete housing. It goes without saying that the structure with the spacer elements can also conversely be arranged centrally and surrounded by the circuit carriers, though partial functions such as that of the housing are then no longer provided. The thermally conductive spacer elements can be screwed together with the horizontal metal carriers (cooling layers), such that each level can be individually tested before the module is joined together. In addition, a circulating coolant can flow through spacer elements and levels in order to homogenize or actively lower the temperature. The coolant can undergo a phase transition for example according to the principle of "heat pipes" in order to increase the heat capacity.

Figure 7:
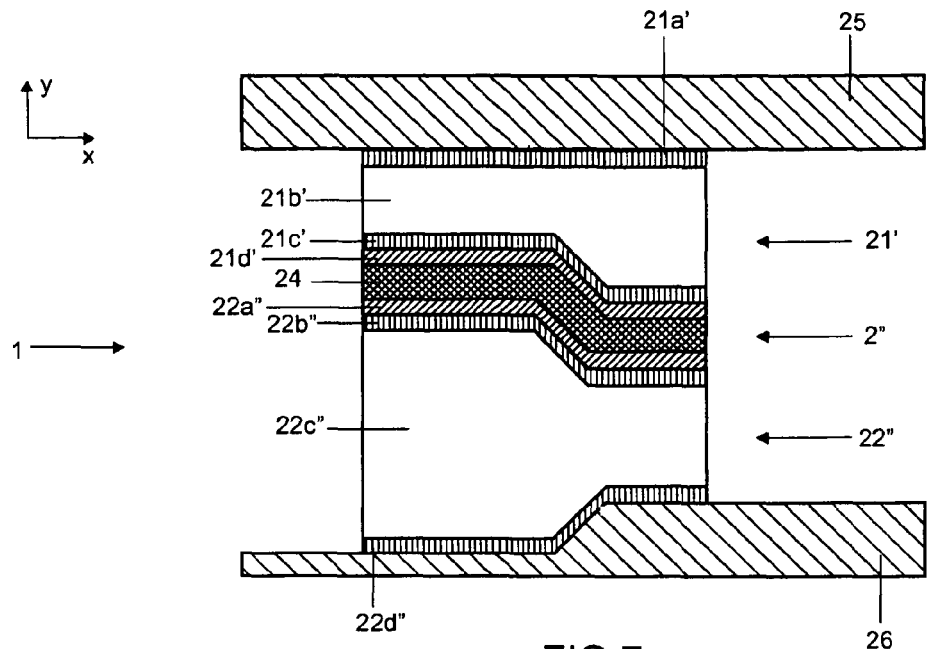
FIG. 7 shows a sectional illustration of a seventh exemplary embodiment of an electronic component module.

A further embodiment of a component module system 1 with an electronic component module 2" is shown in the sectional illustration shown in FIG. 7. The component module 2" has a first multilayer circuit carrier assembly 21' and a second multilayer circuit carrier assembly 22". In this case, an insulating interlayer 24 is situated between the first circuit carrier assembly 21' and the second circuit carrier assembly 22". A cooling arrangement 25 and 26 is arranged respectively at the top sides of the circuit carrier assemblies 21' and 22" remote from said interlayer 24. In the embodiment shown, the first multilayer circuit carrier assembly 21' comprises two insulation layers 21*a*' and 21*c*', a device layer 21*b*' embedded therein, and also a conductor track layer 21*d*'. The conductor track layer 21*d*' adjoins the interlayer 24. The insulation layers 21*a*' and 21*c*' and also the interlayer 24 contain plated-through holes, so-called vias, not illustrated, for making electrical contact with the layers arranged on both sides. Said vias for example also enable electrical contact to be made with the cooling arrangement 25, in order to enable external contact-connection, as well as the current carrying by way of the cooling arrangement 25 if this cannot be performed or is not intended to be performed by the conductor track layer 21*d*'.

The second circuit carrier assembly 22" is embodied analogously to the first circuit carrier assembly 21'. It also has two insulation layers 22*b*" and 22*d*" with a device layer 22*c*" formed between them. A conductor track layer 22*a*" is formed between the insulation layer 22*b*" and the interlayer 24, said conductor track layer, besides the insulation layers 22*b*" and 22*d*", and also the device layer 22*c*" being assigned to the second circuit carrier assembly 22". The further cooling arrangement 26 is arranged in a manner adjoining the lower insulation layer 22*d*".

Such a construction can be implemented not only using LTCC technology but also using conventional technology. The device layers 21*b*' and 22*c*" then comprise SMD components or wired components. The insulation layers 21*a*' and 22*d*" facing or adjoining the cooling arrangements 25 and 26, respectively, are embodied as electrically insulating potting compounds having a high thermal conductivity. The insulation layers 21*c*' and 22*b*" facing the conductor track layers 21*d*' and 22*a*", respectively, are realized by the soldering resist applied on the conductor track layers 21*d*' and 22*a*". The interlayer 24 is formed by the printed circuit board for example composed of FR4 or ER5 material. The printed circuit board can also be embodied as a flexible printed circuit board, also referred to as flexboard. Furthermore, the realization of interlayer 24, conductor track layers 21*d*' and 22*a*" and insulation layers 21*a*', 21*c*', and respectively 22*b*" and 22*d*" can be provided by means of molded leadframe technology.

Besides the cooling arrangements 25 and 26, in the embodiments presented, the interlayer 24 and/or one or more of the insulation layers 21*a*', 21*c*', 22*b*" and 22*d*" can be mechanically supportive or contribute to the mechanical strength of the component module system 1.

The cooling arrangements 25 and 26 are preferably connected to one another at their edge regions laterally with respect to the circuit carrier assemblies 21' and 22" in particular by means of thermally conductive spacer elements. This connection can preferably be formed by vertically oriented spacer elements (not illustrated) which are formed in particular in thermally conductive fashion. The construction specified makes it possible to realize an electronic component module 2" having a respective multilayer circuit carrier assembly 21' and 22" at opposite sides of the interlayer 24, wherein the circuit carrier assemblies 21' and 22" are connected to a respective cooling arrangement 25 and 26 at least in regions at their uncovered top sides, in particular essentially the horizontal top sides. The cooling arrangements 25 and 26 bear directly on said top sides.

Figure 8:
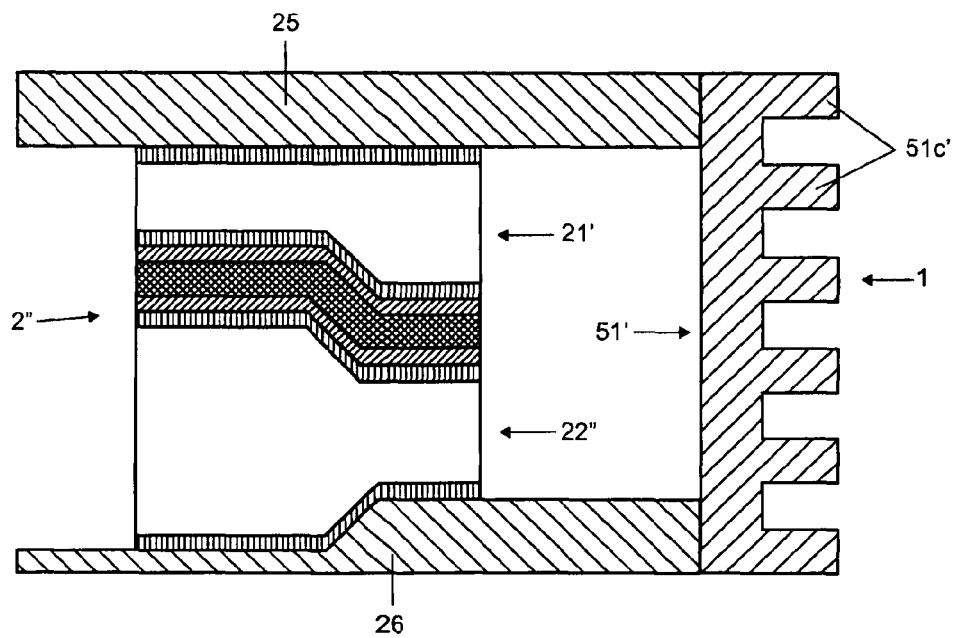
FIG. 8 shows a sectional illustration of an eighth exemplary embodiment of an electronic component module.

A further embodiment of a component module system 1 is shown in the sectional illustration shown in FIG. 8. This corresponds to the embodiment illustrated in FIG. 7, but has a spacer element 51' which is vertically oriented and simultaneously serves as a heat sink and thus enables the dissipation of heat from the two cooling arrangements 25 and 26. A plurality of cooling fins 51*c*' are formed on the spacer element 51, said cooling fins being oriented essentially horizontally and extending in a manner facing away from the circuit carrier assemblies 21' and 22".

Figure 9:
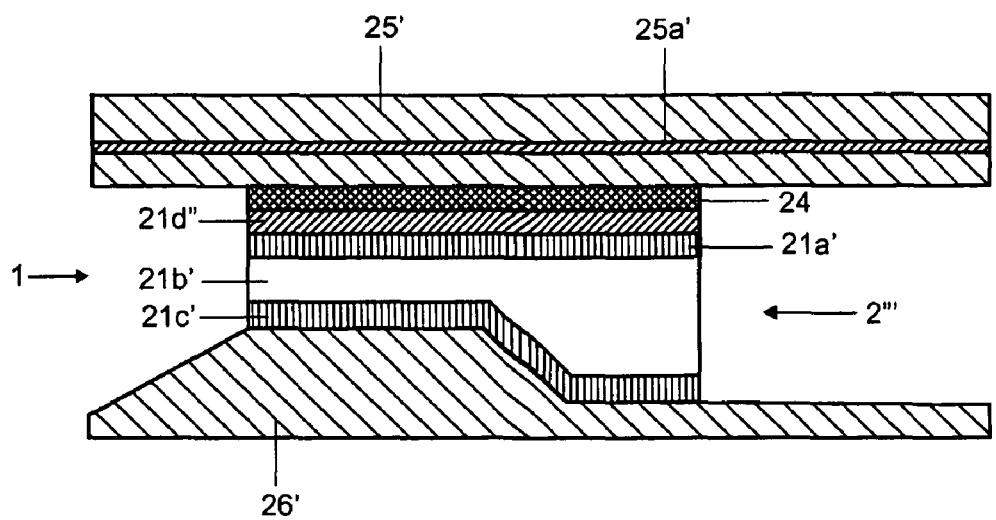
FIG. 9 shows a sectional illustration of a ninth exemplary embodiment of an electronic component module.

A further embodiment of a component module system 1 is shown in the sectional illustration shown in FIG. 9. As can be discerned from the illustration in FIG. 9, a cooling arrangement 25' comprises a channel 25a' for a cooling medium. An interlayer 24 is formed adjacent to this, said interlayer bringing about electrical insulation from the underlying conductor track layer 21d'. An insulation layer 21a' and 21c' is arranged on both sides of a device layer 21b', which insulation layers prevent an undesired electrical connection. The layers 21a' to 21d' mentioned are assigned to the circuit carrier assembly 2'''. In contrast to the embodiments of a component module system 1 illustrated in FIGS. 7 and 8, dissipation of heat from the device layer 21b' is now effected by two cooling arrangements 25' and 26' arranged on both sides.

In all the embodiments, the cooling arrangements can also be dimensioned differently in a horizontal direction and have a different shaping. In particular in order to be able to arrange further electronic elements into a component module system, one or a plurality of cutouts can also be provided in the cooling arrangements. Thus, it may also be provided that an ignition transformer is additionally arranged in the component module system 1, such that the component module system 1 can be used for example for gas discharge lamp operation. Electronic ballasts or lamp operating devices can also be arranged in the system. However, it may also be provided that such component module systems 1 are embodied for the automotive engineering sector and are designed for example for engine control.

In the embodiments, by way of example, integrated circuits are formed on the LTCC layers. Other components such as power transistors, resistors or light emitting diodes can also be arranged in addition to or instead of the integrated circuits. The arrangement of these integrated circuits on the LTCC layers bearing against the cooling arrangement has the advantage that no plated-through holes through the overlying LTCC layers are necessary. What can furthermore be achieved by this configuration is that better heat dissipation to the cooling arrangements can be made possible. In this regard, the relatively large lateral bearing area enables particularly effective horizontal heat dissipation without additional vias since the circuit carrier assembly is linked directly to the cooling arrangement.

The invention claimed is:

1. An electronic component module comprising at least one first multilayer circuit carrier assembly having a top and bottom side and a cooling arrangement,
   wherein the cooling arrangement is contact-connected to the top side of the circuit carrier assembly and said at least one first circuit carrier assembly being electrically connected at said bottom side to a second circuit carrier assembly such that a stack is formed,
   wherein the cooling arrangement is configured such that heat generated during operation of the electronic component module can be dissipated in a lateral direction with respect to the arrangement of the circuit carrier assembly by means of the cooling arrangement
   wherein an insulating interlayer is formed between the first multilayer circuit carrier assembly and the second multilayer circuit carrier assembly and the cooling arrangement is arranged at the top sides of the first circuit carrier assembly and the second circuit carrier assembly, remote from said interlayer
   wherein the cooling arrangement is connected to at least one second thermal cooling arrangement located on the top side of the second multilayer circuit carrier assembly by at least one thermally conductive spacer element
   wherein the spacer elements are arranged in electrically insulating fashion and the cooling arrangements can be put at different electrical potentials
   wherein electrical contact is made with the component module toward the outside by means of the at least two cooling arrangements that are at different electrical potentials.

2. The electronic component module as claimed in claim 1, wherein the cooling arrangement extends beyond the dimensions of the circuit carrier assembly in a lateral direction at least at one side of the circuit carrier assembly.

3. The electronic component module as claimed in claim 1, wherein the cooling arrangement is arranged in plate-type fashion at least in regions.

4. The electronic component module as claimed in claim 1, wherein the cooling arrangement is arranged at least in regions as a side wall of a housing of the electronic component module.

5. The electronic component module as claimed in claim 1, wherein at least one either the first or second multilayer circuit carrier assembly has at least one insulation layer, at least one device layer and at least one conductor track layer.

6. The electronic component module as claimed in claim 5, wherein the conductor track layer adjoins the insulating interlayer and the cooling arrangement adjoins the insulation layer.

7. The electronic component module as claimed in claim 1, wherein the cooling arrangement is formed from metal at least in regions.

8. The electronic component module as claimed in claim 7, wherein at least one third circuit carrier assembly is arranged that is contact-connected to a further cooling arrangement, wherein the cooling arrangement contact-connected to the first and the second circuit carrier assemblies is connected to the further cooling arrangement by at least one spacer element.

9. The electronic component module as claimed in claim 8, wherein components selected from the group consisting of ball grid arrays, spring contacts, and pluggable pins are formed as electrical contact-connection between the third circuit carrier assembly and the first or the second circuit carrier assembly.

10. The electronic component module as claimed in claim 1, wherein continuous electrical contact-connections for making contact with circuit carrier assemblies arranged one above another are formed in the cooling arrangement, wherein the electrical contact-connections are insulated from the cooling arrangement.

11. The electronic component module as claimed in claim 1, wherein at least one circuit carrier assembly has a plurality of LTCC layers with integrated devices.

12. The electronic component module as claimed in claim 8, wherein a plug connection for externally making electrical contact with the electronic component module is introduced into the cooling arrangement.

13. The electronic component module as claimed in claim 1, wherein cooling fins are formed at least at the edge regions of the cooling arrangements.

14. The electronic component module as claimed in claim 1, wherein at least one circuit carrier assembly, one interlayer, one of the cooling arrangements is embodied using molded leadframe technology.

15. The electronic component module as claimed in claim 2, wherein the cooling arrangement is arranged in plate-type fashion at least in regions.

* * * * *